Aug. 4, 1970 K. D. WRIGHT 3,522,456

ELECTRONIC BISTABLE CIRCUIT

Filed Oct. 23, 1965 2 Sheets-Sheet 1

INVENTOR.
Kenneth D. Wright.

BY

Harness, Dickey & Pierce

ATTORNEYS.

Aug. 4, 1970 K. D. WRIGHT 3,522,456
ELECTRONIC BISTABLE CIRCUIT
Filed Oct. 23, 1965
2 Sheets-Sheet 2
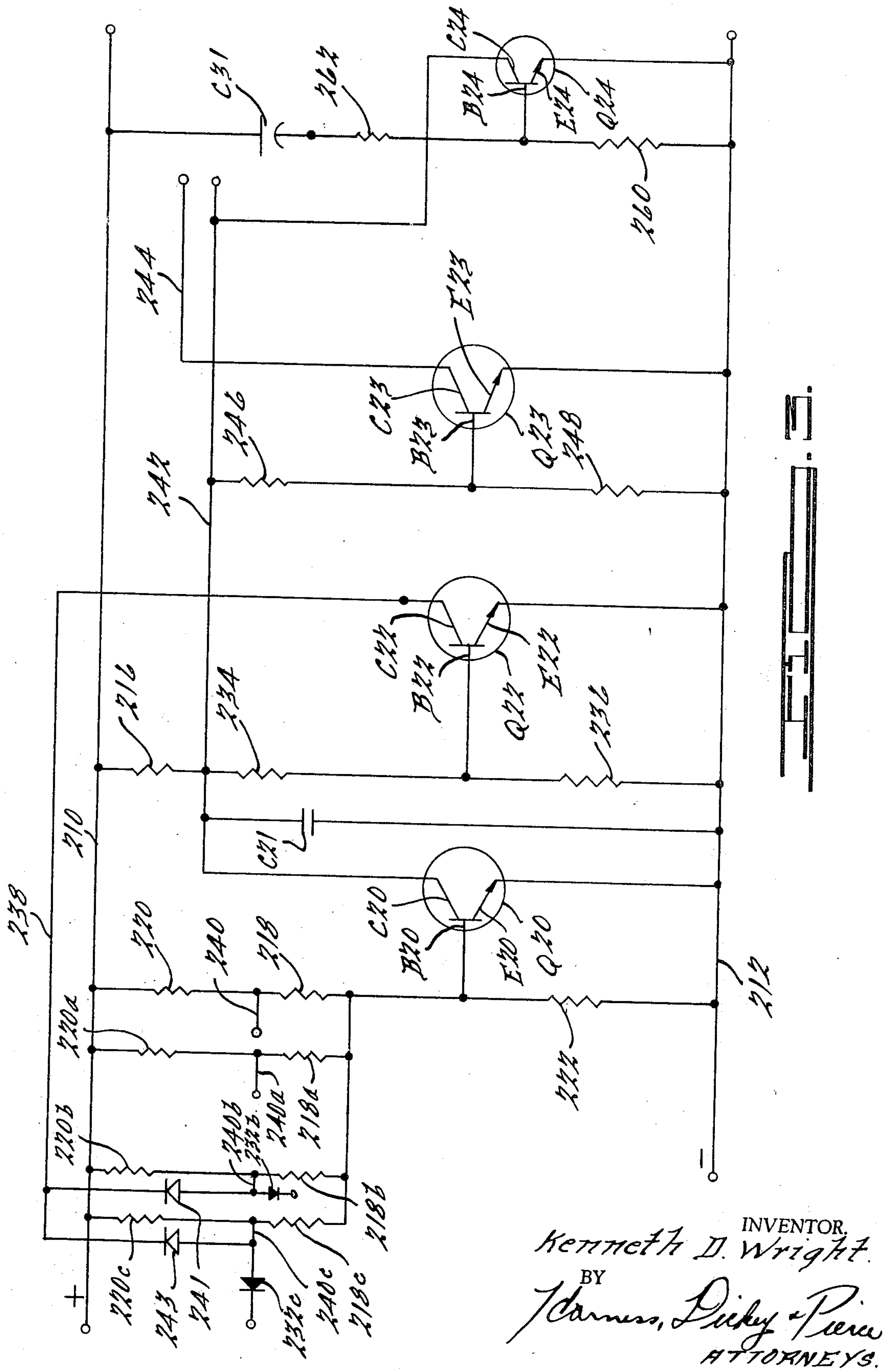
INVENTOR.
Kenneth D. Wright
BY
Harness, Dickey & Pierce
ATTORNEYS.

United States Patent Office 3,522,456
Patented Aug. 4, 1970

3,522,456

ELECTRONIC BISTABLE CIRCUIT

Kenneth D. Wright, Pontiac, Mich., assignor to Design Products Corporation, Troy, Mich., a corporation of Michigan Filed Oct. 23, 1965, Ser. No. 508,638
Int. Cl. H03k 3/12
U.S. Cl. 307—292 3 Claims

ABSTRACT OF THE DISCLOSURE

An electronic logic circuit including first and second transistors with the conductivity of the second being controlled by the first and including a feedback circuit whereby the second transistor, once actuated, will control the first transistor whereby the second transistor will be maintained in its actuated state.

This application is a continuation-in-part of my co-pending application, Ser. No. 406,998, filed Oct. 28, 1964.

This invention relates to electronic logic circuits and more specifically to electronic circuits of the bistable type.

The logic circuit which is here shown to embody the features of the present invention is of the bistable type in which first and second conductive elements are interconnected such that when the first conductive element is in a conductive state the second conductive element is maintained off and when the first conductive element is rendered nonconductive the second conductive element is rendered conductive and the first conductive element is maintained off; the conductive conditions of the elements are controlled by electrical signals or pulses. In past constructions it has been important that such logic circuitry be carefully shielded and isolated from other circuits and electrical lines in order that the conductive conditions not be accidentally changed by transient pulses through inductive or capacitive coupling or through variations in the line. In the past with such circuits, it has been frequently necessary to employ some type of time delay mechanism in the power supply such that the bistable circuit will not be inadvertently triggered into a different condition by any potential surges occurring when the power supply is first turned on. The latter is especially significant when it is realized that in turning the equipment "on," the operator will expect the logic circuit to be in a known condition. In the circuit of the present invention the above-named problems are eliminated. Therefore, it is an object of this invention to provide a novel logic circuit in which the conductive condition of the circuit is substantially unaffected by transients. In the bistable circuit of the present invention means are provided for increasing the output capacity whereby more circuitry or equipment can be operated therefrom.

It is a general object of this invention to provide a novel bistable circuit.

One form of the present invention is a novel, simple, logic circuit of the type known as a "sealed and." The "sealed and" of the present invention, in addition to possessing the previous advantages referred to above, is less complex and more versatile than other known "sealed and" circuits. Therefore, it is another object of the present invention to provide a novel, improved logic circuit of the "sealed and" type.

In a second embodiment, a different type logic circuit is provided which is hereinafter referred to as a "multi-input memory circuit." The latter circuit is similar to the "sealed and" circuit but has several inputs and is capable of remembering the simultaneous occurrence of pulses at these several inputs. The "multi-input memory circuit" is a bistable circuit and can be constructed to possess the advantages of the improved bistable circuit initially mentioned. Therefore, it is still another object of this invention to provide a unique multi-input memory logic circuit.

Other objects, features and advantages of the present invention will become apparent from the subsequent description and the appended claims taken in conjunction with the accompanying drawings, in which:

FIG. 3 is a schematic diagram of still another embodiment of a multi-input memory circuit embodying features of the present invention.

Figure 1:
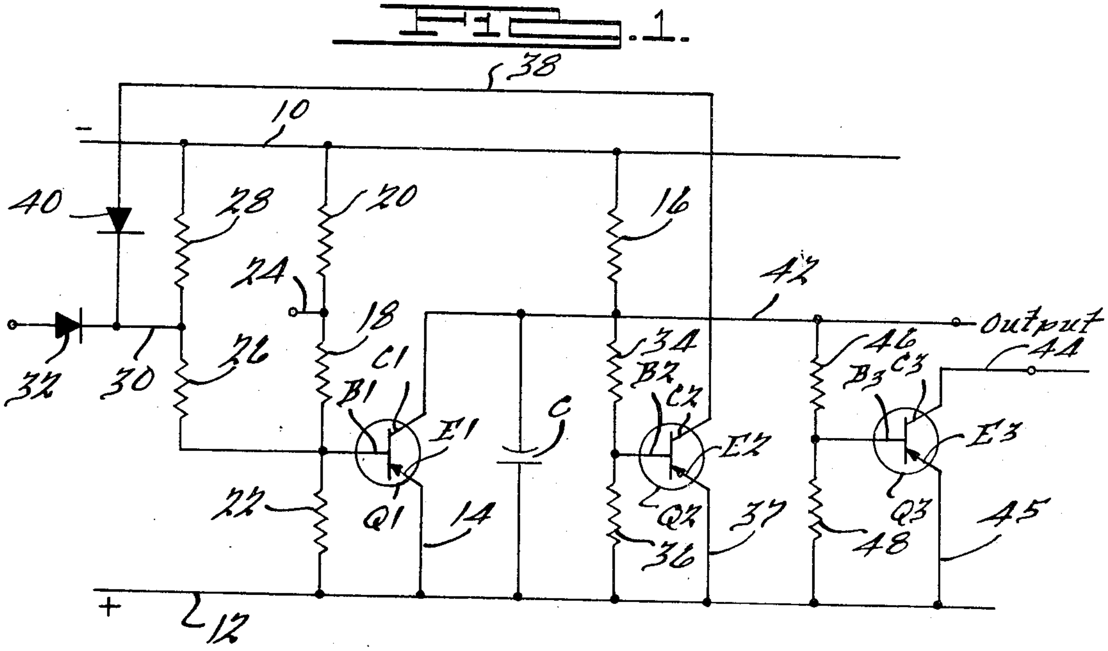
FIG. 1 is an electrical schematic diagram of a "sealed and" circuit embodying the features of the present invention.

Looking now to FIG. 1, the "sealed and" circuit in general includes first and second transistors Q1 and Q2 of the P-N-P type with the transistor Q1 having a base, collector and emitter electrodes B1, C1 and E1, respectively, and with the transistor Q2 having base, collector and emitter electrodes B2, C2 and E2, respectively. For purposes of energizing the circuit of FIG. 1, a conductor 10 is connected to the negative side of a direct current source (not shown) and a conductor 12 to the positive side. The transistor Q1 has its collector-emitter circuit connected between the conductors 10, 12 with the emitter E1 connected directly to the positive conductor 12 via conductor 14 and with the emitter E1 connected to the negative conductor 10 via a load resistor 16. Transistor Q1 is provided with bias means in the form of a voltage divider circuit which includes a resistor 18 serially connected to a resistor 20 and connected between the base B1 and the negative conductor 10 and a resistor 22 connected between the base B1 and the positive conductor 12. The junction 24 between the resistors 18 and 20 is utilized as a first input for the purpose of introducing a control or maintained signal to the base B1 which operates on the circuit in a manner to be described. The bias circuit for transistor Q1 further includes a resistor 26 which is serially connected to the base B1 and to a resistor 28 which is in turn connected to the negative conductor 10.

A conductor 30 connects the junction of resistors 26 and 28 to the cathode of a diode 32 which is utilized as a second input and has its anode being connected to additional circuitry (not shown) for providing input pulses. As shown and described thus far in FIG. 1, the values of the various resistors are selected such that with no signals at either input, i.e., conductor 24 and diode 32, the transistor Q1 will be in a conductive condition whereby current will flow through the collector-emitter circuit through the load resistor 16. The diode 32 will transmit to base B1 only positive pulses which are selected to be of a magnitude such as to render the transistor Q1 nonconductive for a period during that pulse under certain conditions. The input at conductor 24 will normally be a sustained control signal of a positive potential which renders the bias path through resistors 18 and 20 ineffective with regard to the base B1. However, with no signal input at diode 32, the transistor Q1 is still biased "on" via the resistors 26 and 28. The transistor Q1 can be turned "off" by a positive pulse through diode 32. However, the pulses through diode 32 will be effective in transistor Q1 only as long as the control signal is maintained at conductor 24.

The output of transistor Q1 is connected to the input of transistor Q2 via the load resistor 16. Resistor 16 forms a part of the base-emitter biasing network of Q2 and is serially connected to a resistor 34 which is connected to the base B2 with the biasing circuit being completed by a resistor 36 which is connected between the base B2 and the positive conductor 12. Thus with the transistor Q1 in a conductive state the bias of base B2 will be dropped to a point at which transistor Q2 will be rendered nonconductive and will remain nonconductive as long as transistor Q1 conducts.

The output circuit of transistor Q2 is connected to the input of transistor Q1. The emitter E2 is connected directly to the positive conductor 12 via a conductor 37. The collector C2 is connected to the input circuit of transistor Q1 via a conductor 38 and a diode 40 which has its anode connected to conductor 38 and its cathode connected to the conductor 30. The diode 40 isolates the collector C2 from input pulses through diode 32 and the diode 32 isolates the input circuitry from the output of transistor Q2 passing through diode 40.

With a control signal at conductor 24, an input pulse through diode 32 will render transistor Q1 nonconductive and transistor Q2 will be rendered conductive due to the increase in potential difference between base B2 and emitter E2 as a result of the change in potential at the juncture between resistors 16 and 34. As the transistor Q2 conducts, the potential difference between the base B1 and emitter E1 of transistor Q1 is reduced, hence preventing Q1 from conducting again even after cessation of the pulse at diode 32 and hence Q1 is maintained nonconductive.

In conventional "sealed and" circuits the output is taken from the output circuit of the element which would correspond to transistor Q2. Variations in output load, however, could affect the feedback from this element and hence affect its ability to control the other element corresponding to transistor Q1. In the "sealed and" circuit of FIG. 1 the output is not taken from transistor Q2 and hence transistor Q2 will effectively control transistor Q1 regardless of the load. An output from the "sealed and" circuit of FIG. 1 is provided at a conductor 42 which is electrically connected to the juncture between resistors 16 and 34 and can be utilized in a number of succeeding circuits (not shown). In order to increase the capability of the bistable circuitry of FIG. 1 to operate on or actuate other additional circuitry, an additional transistor Q3 of the P-N-P type is provided. The transistor Q3 has a base, collector and emitter electrodes B3, C3 and E3, respectively. While an output can be obtained at conductor 42 the principal output is provided by transistor Q3 at a conductor 44 which is connected directly to the collector C3 and which is returned to the direct current source through the load (not shown). The emitter E3 of transistor Q3 is connected directly to the positive conductor 12 via a conductor 45. Bias of the base B3 is provided by a circuit which connects the base B3 to negative conductor 10 via a resistor 46 and resistor 16 and which connects the base B3 to the positive conductor 12 via resistor 48. Base B3 is connected to the output transistor Q1 via conductor 42 which is connected between resistors 16 and 34. Thus transistor Q3 will be controlled in the same manner as and will have an output similar to that of transistor Q2. With the circuitry described, an output can be taken from conductors 42 or 44 with the principal output being at conductor 44 and a substantial load can be drawn from transistor Q3 without affecting the operational relationship between transistors Q1 and Q2. Once the transistor Q1 has been rendered nonconductive by conduction of transistor Q2, it will remain nonconductive even after cessation of the input pulse at diode 32. The "sealed and" circuit can be returned to its initial condition by removing the control signal at conductor 24; this will render transistor Q1 conductive and turn transistor Q2 "off."

As previously noted, it is desired that the initial condition of Q2 be nonconductive while that of the transistor Q1 be conductive. With the occurrence of a transient pulse in the line or from the power supply appearing at the diode 32, it is possible for the transistor Q1 to be momentarily turned off, thereby turning Q2 on, thereby providing an erroneous output signal at conductors 42 and 44. Likewise, in turning the equipment on, it is desired that under initial conditions the transistor Q1 be automatically turned "on" and transistor Q2 be "off"; however, it is possible with a control signal being applied to conductor 24 that transients in initially energizing the power supply could turn Q1 "off," rendering Q2 conductive and hence place the "sealed and" circuit in its alternate condition contrary to the expectations of the operator and hence provide for erroneous information at conductors 42 and 44. In order to prevent such errors of the bistable circuit, a capacitor C is connected between the collector C1 and the positive conductor 12 to introduce a time delay in the circuit such that transients or pulses of short duration which are transmitted through diode 32 and momentarily turn Q1 "off" be ineffective to turn Q2 "on." This is accomplished by selecting the value of C relative to the other resistive elements in the circuit such that the RC time constant is greater than the expected transient pulse width such that with Q1 "off" as the result of a transient, the capacitor C will not discharge sufficiently to permit Q2 to turn "on" until the transient has terminated and Q1 is again rendered conductive. Of course, the RC time constant of the circuit including capacitor C is selected to be short relative to the signals normally applied at the diode 32 and conductor 24 such as to be ineffective in the operation of the circuit as to these signals. The capacitor C also insures that transistor Q1 will be turned on first when the "sealed and" circuit is initially energized and has a control signal applied to the conductor 24. Here the capacitor C initially provides a low impedance path preventing a buildup of sufficient potential at the base B2 to turn Q2 on before Q1 is conductive and thus the initial, desired conditions of transistors Q1 and Q2 are assured.

Note that only a single input pulse circuit, diode 32, etc., and a single control signal circuit, conductor 24, etc., are shown. The bistable circuit of FIG. 1 could be readily modified to accommodate several such input pulse circuits by merely duplicating the network consisting of resistors 26, 28 and diode 32. In that event transistor Q1 could be turned "off" only by the simultaneous presence of input signals at each of the input pulse circuits with a control signal at the conductor 24. Likewise, the bistable circuit of FIG. 1 could be readily modified to accommodate several control signal circuits by merely duplicating the network consisting of resistors 18, 20 and conductor 24. In that event transistor Q1 could be turned "off" by a pulse at diode 32 only with the simultaneous presence of control signals at each of the control signal circuits.

The circuit of FIG. 1 can be utilized as a monostable circuit either by providing the signal at the input conductor 24 to be constantly maintained or by connecting the collector C2 to the conductor 24 through a diode similar to diode 40.

Figure 2:
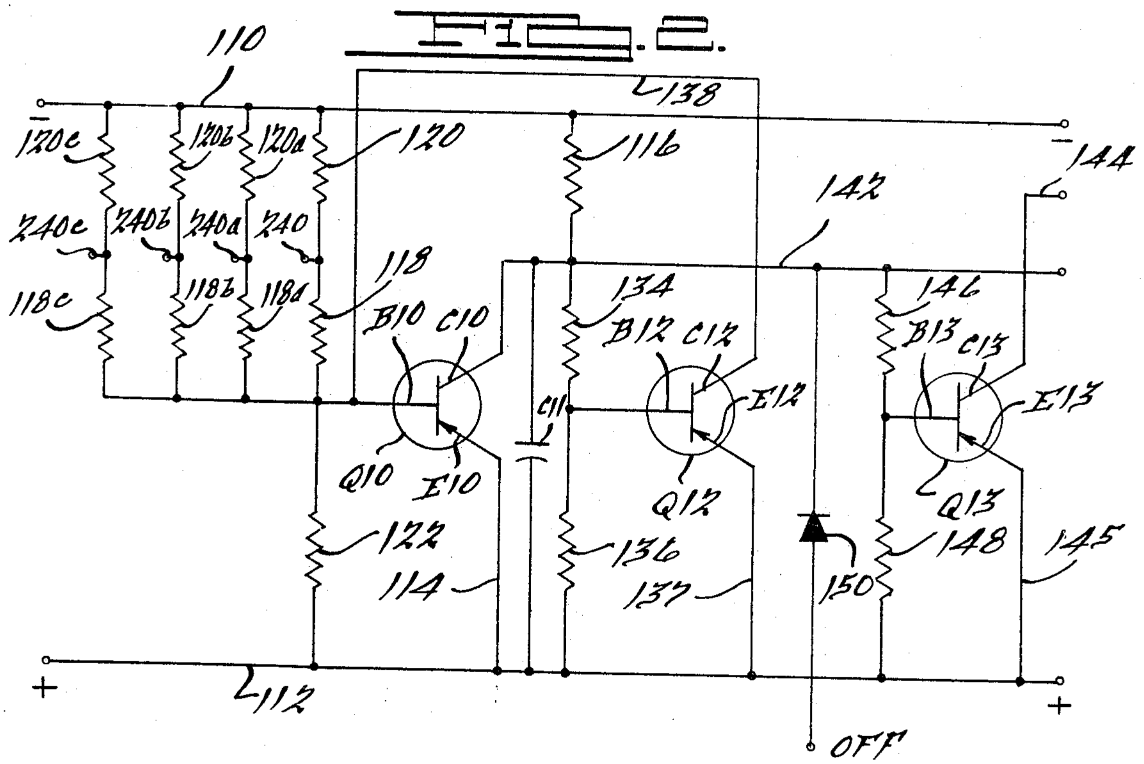
FIG. 2 is an electrical schematic diagram of a multi-input memory circuit embodying features of the present invention.

A similar construction can be provided for the multi-input logic circuit of FIG. 2. Looking now to FIG. 2, the bistable circuit has transistors Q10 and Q12 which are of the P-N-P type. The transistor Q10 has base, collector and emitter electrodes B10, C10 and E10, respectively, and the transistor Q12 has base, collector and emitter electrodes B12, C12 and E12, respectively. The transistor Q10 has an output circuit connected between a negative conductor 110 and a positive conductor 112 and has the emitter E10 connected directly to the positive conductor 112 via conductor 114 and the collector C10 connected to the negative conductor 110 via a load resistor 116. The transistor Q10 is base biased and has a resistor 122 connecting the base B10 to the positive conductor 112 and a pair of resistors 118 and 120 which are serially connected and connect the base B10 to the negative conductor 110. An input terminal is provided at a connection 240 at the juncture of the resistors 118 and 120. Additional bias and input circuits similar to the combination of resistors 118, 120 and conductor 240 can be connected between base B10 and negative conductor 110 and are shown using similar numbers with letter subscripts. In the circuitry as shown, positive trigger pulses or signals must be present at the same time at each of the terminals 240 to 240*c* whereby the normally conductive transistor Q10 will be rendered nonconductive.

The output from the transistor Q10 is connected directly to the input of the transistor Q12 by means of the resistor 116 and a resistor 134, which is connected between resistor 116 and the base B12. The input and bias circuit of transistor Q12 is completed by a resistor 136 which is connected from the base B12 to the positive terminal 112. Unlike the "sealed and" circuit of FIG. 1 in which feedback is provided from transistor Q2 to the input circuit of transistor Q1, the output from the transistor Q12 is fed directly to the base B10 of transistor Q10 from collector C12 by means of a conductor 138. The emitter E12 is connected to the positive conductor 112 via a conductor 137. Thus when the transistor Q10 is conductive, the transistor Q12 is maintained nonconductive. Upon the occurrence of the positive pulses or signals at each of the input terminals 240 through 240*c*, the transistor Q10 will be rendered nonconductive whereupon the transistor Q12 will be rendered conductive. Upon conduction of the transistor Q12, the transistor Q10 will be maintained "off." Again unlike the "sealed and" of FIG. 1, the mere removal of the pulses or signals from the inputs 240 through 240*c* cannot render transistor Q10 conductive because of the direct connection from collector C12 to base B10.

For the same reasons mentioned in the discussion of FIG. 1, no output is taken from transistor Q12 in order to insure its capability to render Q10 nonconductive regardless of variations in the output load. Thus the output for the circuit of FIG. 2 is taken from a conductor 142 which is connected between resistors 116 and 134. The principal or main output for supplying additional equipment or circuits is provided by means of the transistor Q13. Transistor Q13 is of the P-N-P type and has base, collector and emitter electrodes B13, C13 and E13 and is base biased by means of a resistor 146, which connects the base B13 to the output conductor 142 and a reistor 148 which connects the base B13 to the positive conductor 112. The output of the transistor Q13 and hence the principal output of the circuit of FIG. 2 is taken from the collector C13 by means of a conductor 144 which is returned to the direct current source through the load (not shown). The emitter E13 being connected directly to the positive conductor 112 via a conductor 145.

In order that the transistor Q12 can be turned "off" and transistor Q10 turned "on" to reinstate the initial conductive condition of the circuit of FIG. 2, an "off" circuit is provided by means of a diode 150 which has its cathode connected to the conductor 142 and its anode connected to a selectively actuated pulse circuit (not shown). Thus transistor Q12 can be turned off by the application of a positive pulse through the diode 150 whereby the transistor Q10 is once again placed in a conductive state. Once the conductive state of Q10 has been reinstated, the transistor Q12 will be maintained "off" even after the removal of the input pulse through the diode 150.

As in the case of the circuit of FIG. 1, the circuit of FIG. 2 would also normally be responsive to transients appearing in the line as a result of inductive or capacitive coupling and also as a result of turning the equipment "on" or "off." In order to prevent the transistors Q10 and Q12 from inadvertently changing condition, a capacitor C11 is connected between the collector C10 and the positive conductor 112. The capacitor C11 is of a magnitude relative to the impedance of the associated circuitry to provide an RC time constant which is of long duration relative to the expected duration of a transient such that transients will not affect the conductive condition of the transistors Q10 and Q12. However, the RC time constant of the circuit including C11 is of a short time relative to the known pulse width to be applied at the inputs 240 to 240*c* whereby the operation of transistors Q10 and Q12 will be unaffected by capacitor C11. The capacitor C11 also insures that, in initially turning the circuit of FIG. 2 "on," the transistor Q10 will be turned "on" and transistor Q12 will be "off."

Thus in both of the circuits shown and described, the circuitry is not sensitive to transients occurring through conductive or capacitive coupling or occurring as the result of switching the power supply "on" and hence can be used without expensive shielding and without special circuitry in the associated power supply. Note that while the circuits of FIGS. 1 and 2 have been shown utilizing P-N-P type transistors, with some slight changes N-P-N type could be used by those skilled in the art.

Looking now to the embodiment in FIG. 3, a multi input memory circuit utilizing N-P-N type transistors is shown. In the circuit of FIG. 3, a pair of conductors 210 and 212 are connected to positive potential and ground, respectively. A first N-P-N type transistor Q20 has its base electrode B20 connected to ground via a resistor 222 and has its emitter electrode E20 connected directly to ground and its collector electrode C20 connected to the positively connected conductor 210 via a resistor 216. The resistor 216 is part of the voltage dividing network and is connected in series with conductors 234 and 236 between conductors 210 and 212. The base electrode B20 is also connected to the positively connected conductor 220 through a plurality of input circuits. The input circuits include a pair of circuits for receiving control signals with the first of these circuits including serially connected resistors 218 and 220 and the second including serially connected resistors 218*a* and 220*a*. The input circuits include a pair of circuits for receiving input pulse signals; the first of these circuits includes serially connected resistors 218*b* and 220*b* and the other includes resistors 218*c* and 220*c*. The serial circuits of resistors 218, 220 and 218*a*, 220*a* and 218*b*, 220*b* and 218*c*, 220*c* are all connected in parallel. The juncture 240 between resistors 218 and 220 and the juncture 240*a* between resistors 218*a* and 220*a* are provided to receive control signals which would normally be maintained inputs. The juncture 240*b* between resistors 218*b* and 220*b* and the juncture 240*c* between resistors 218*c* and 220*c* are adapted to be connected to an input pulse signal source via diodes 232*b* and 232*c*.

The transistor Q20 is biased to be normally "on" and will be rendered nonconductive when sustained negative control signals appear at the junctures 240 and 240*a* along with the simultaneous occurrence of negative input pulses at the junctures 240*b* and 240*c* via the diodes 232*b* and 232*c*. With the transistor Q20 in the conductive state, the transistor Q22, which is connected to the output of transistor Q20 is maintained in a nonconductive state. Transistor Q22 has its base electrode B22 connected to the juncture between resistors 234 and 236 and has its emitter E22 connected to the ground or negative potential conductor 212 and has its collector electrode C22 connected to the input pulse circuits for the transistor Q20 via a conductor 238. The conductor 238 is connected to the juncture 240*b* via a diode 241 and connected to the juncture 240*c* via diode 243. Thus then the transistor Q22 is rendered conductive, it will apply a negative signal or potential to the junctures 240*b* and 240*c* whereby, with the sustained negative signals being applied to junctures 240 and 240*a*, the transistor Q20 will be maintained in an off condition even after input pulses through the diodes 232*b* and 232*c* have been removed. A capacitor C21 is connected between the collector electrode C20 and emitter electrode E20 of the transistor Q20 and serves a function similar to the capacitors C in FIG. 1 and C11 in FIG. 2, as previously described. The transistor Q23 serves a function similar to the transistors Q3 in FIG. 1 and Q13 in FIG. 2. The conductor 242 is connected to the juncture between resistors 216 and 234 in the output circuit of the transistor Q20 and provides an output signal therefrom. The transistor Q23 has its base electrode B23 connected to ground conductor 212 via a resistor 248 and connected to the conductor 242 via a resistor 246. Transistor Q23 has its emitter electrode E23 connected directly to the ground conductor 212 and has its collector electrode C23 connected to a conductor 244 whereby an additional output signal can be received conductor 244 is returned to the direct current source through the load (not shown). The circuit thus far described would function in a manner similar to the circuitry described in FIG. 2. However, in order to further insure that upon initially turning the circuit on the transistor Q20 will be rendered conductive, a power reset circuitry is provided in the form of the N-P-N transistor Q24 which has its base electrode B24 connected to the negative conductor 212 via a resistor 260 and has its emitter electrode E24 connected to the ground conductor 212 and has its collector electrode C24 connected to the conductor 242. The base electrode B24 is also connected to the positively connected conductor 210 via a resistor 262 and a capacitor C31. Capacitor C31 and resistors 262 and 260 are provided such that initially upon turning the circuitry of FIG. 3 to an "on" condition, the capacitor C31 provides a low impedance path for current between conductors 210 and 212 to immediately assure that transistor Q24 will be placed in an "on" or conductive condition. With the collector C24 connected to the conductor 242 this will present to the transistor Q22 a condition similar to that as if transistor Q20 had been turned "on" or rendered conductive. Thus, if through transients in initially turning the circuit of FIG. 3 "on," the transistor Q22 is turned "on" it would normally then maintain the transistor Q20 "off" providing an erroneous starting condition. However, with Q24 assured of being "on" initially when the circuit of FIG. 3 is turned "on," the transistor Q22 will be either turned off if it is on or maintained off. This will assure that the transistor Q20 will be placed in an on or conductive condition, when transistor Q20 has been turned on, of course, then transistor Q22 will be maintained off by virtue of the conduction of transistor Q20. The current through the capacitor C31 and resistors 262 and 260 will diminish until the capacitor C31 is charged at which point transistor Q24 will be turned off and maintained off. The value of the capacitor C31 and resistors 262 and 260 relative to the parameters of the transistor Q24 is selected such that the time interval for which transistor Q24 is rendered conductive will be sufficient to take care of any transients which might possibly occur in initially turning the circuit of FIG. 3 on. After this interval has passed of course then transistor Q24 will be rendered nonconductive and essentially will be out of the circuit. When the circuitry of FIG. 3 is turned off, capacitor C31 can have sufficient time to discharge whereby the circuitry for transistor Q24 will again be in condition to be operative to prevent the inadvertent conduction of transistor Q22 when the circuit of FIG. 3 is again turned on. Note that capacitor C21 still serves the function of preventing a change of condition in the circuit of FIG. 3 due to transients occurring after transistor Q24 is rendered nonconductive.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. A multi-input memory circuit assembly comprising:

a first asymmetric conducting device having a pair of first control electrodes and a pair of first principal electrodes with said first principal electrodes having a conductive and a nonconductive condition determined by the conductive state of said first control electrodes, a second asymmetric current conducting device having a pair of second control electrodes and a pair of second principal electrodes with said second principal electrodes having a conductive and a nonconductive condition determined by the conductive state of said second control electrodes, first circuit means connecting said first principal electrodes to said second control electrodes for rendering and maintaining said second device nonconductive responsively to conduction of said first principal electrodes, input means electrically connected to said first control electrodes for changing the conductive state of said first control electrodes and hence for changing the conductive state of said first principal electrodes, said input means comprising a plurality of input circuits and electrical circuit means connecting said input circuits to said first control electrodes for rendering said first device nonconductive only when an input control signal is present at each of said input circuits, second circuit means connecting said second principal electrodes directly to said first control electrodes for maintaining said first principal electrodes nonconductive with conduction of said second principal electrodes even after removal of said control signal from any of said input circuits, said second circuit means comprising a diode connected to isolate said second principal electrodes from potentials of one polarity at said one of said input circuits.

2. A bistable circuit comprising: a first element having a conductive and a nonconductive condition, a second element having a conductive and a nonconductive condition, first circuit means connecting said first element and said second element for maintaining said first element nonconductive responsively to conduction of said second element and for rendering and maintaining said second element nonconductive responsively to conduction of said first element and for rendering said second element conductive responsively to nonconduction of said first element, input means for providing a signal for changing the conductive state of said first element, and delay means for providing a time delay for a preselected time interval in the response of said second element to the change in the conductive state of said first element, said delay means comprising a third element having a conductive and a nonconductive condition, second circuit means connecting said third element to said first and second elements for maintaining said second element in one conductive state responsively to said third element being in a first conductive state, and third circuit means for rendering said third element normally in said first conductive state and for rendering and maintaining said third element in its other conductive state after said preselected time interval.

3. A bistable circuit comprising: a first asymmetric current conducting device having a conductive and a nonconductive condition, a second asymmetric current conducting device having a conductive and a nonconductive condition, first circuit means connecting said first device and said second device for maintaining said first device nonconductive responsively to conduction of said second device and for rendering and maintaining said second device nonconductive responsively to conduction of said first device and for rendering said second device conductive responsively to nonconduction of said first device, means for providing a time delay for a preselected time interval in the response of said second device to the change in the conductive state of said first device, and second time delay means for rendering said second device nonconductive for a second preselected time interval, said second time delay means comprising a third asymmetric current conducting device having a conductive and a nonconductive condition, and second circuit means connecting said third device to said first and second devices for maintaining said second device in one conductive state responsively to said third device being in a first conductive state, and third circuit means for rendering said third device normally in said first conductive state and for rendering and maintaining said third device in its other conductive state after a preselected duration.

References Cited

UNITED STATES PATENTS

| | | | |
|---|---|---|---|
| 2,997,602 | 8/1961 | Eachus | 307—292 |
| 3,238,387 | 3/1966 | Hill | 307—292 |
| 3,283,175 | 11/1966 | Webb | 307—292 |
| 3,348,069 | 10/1967 | Petschauer | 307—292 |
| 3,041,477 | 6/1962 | Budts et al. | 307—291 |
| 3,069,600 | 12/1962 | Leeson et al. | 307—289 |
| 3,127,523 | 3/1964 | Jallen | 307—289 |
| 3,201,773 | 8/1965 | Magee | 307—289 |
| 3,253,133 | 5/1966 | Rabinocivi et al. | 307—237 |
| 3,278,759 | 10/1966 | Rekiere | 307—292 |
| 3,214,606 | 10/1965 | Wilson | 307—291 |

FOREIGN PATENTS

| | | |
|---|---|---|
| 648,334 | 9/1962 | Canada. |

DONALD D. FORRER, Primary Examiner

J. D. FREW, Assistant Examiner

U.S. Cl. X.R.

307—289, 291, 293